United States Patent
Merchant et al.

(10) Patent No.: US 6,784,478 B2
(45) Date of Patent: Aug. 31, 2004

(54) JUNCTION CAPACITOR STRUCTURE AND FABRICATION METHOD THEREFOR IN A DUAL DAMASCENE PROCESS

(75) Inventors: Sailesh M. Merchant, Orlando, FL (US); Yifeng W. Yan, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/260,693

(22) Filed: Sep. 30, 2002

(65) Prior Publication Data

US 2004/0061177 A1 Apr. 1, 2004

(51) Int. Cl.[7] .................. H01L 27/108; H01L 29/76; H01L 29/94; H01L 31/119
(52) U.S. Cl. .................. 257/303; 257/304; 257/308; 438/253; 438/261; 438/396; 438/620; 438/622
(58) Field of Search .................. 257/304, 307, 257/308, 758, 302, 303; 438/253, 261, 396, 620, 622

(56) References Cited

U.S. PATENT DOCUMENTS

| | | | |
|---|---|---|---|
| 5,940,677 A | * | 8/1999 | Yamauchi et al. ............. 438/3 |
| 6,174,769 B1 | | 1/2001 | Lou |
| 6,218,255 B1 | | 4/2001 | Fritzinger et al. ........... 438/386 |
| 6,255,688 B1 | | 7/2001 | Lee et al. .................... 257/311 |
| 6,271,596 B1 | | 8/2001 | Alers ........................... 257/774 |
| 6,320,244 B1 | | 11/2001 | Alers et al. .................. 257/534 |
| 2001/0026003 A1 | * | 10/2001 | Yoshitomi et al. ........... 257/536 |
| 2003/0062564 A1 | * | 4/2003 | Kobayashi et al. .......... 257/306 |
| 2003/0113974 A1 | | 6/2003 | Ning et al. |

FOREIGN PATENT DOCUMENTS

GB    2 371 147 A    7/2002

* cited by examiner

*Primary Examiner*—Hsien Ming Lee (57) ABSTRACT

An apparatus and fabrication process for a capacitor formed in conjunction with a dual damascene process. A bottom capacitor plate is electrically connected to an overlying first conductive via formed according to the dual damascene process. A top capacitor plate is connected to an overlying second conductive via. A dielectric material is disposed between the top and the bottom plates. The capacitor is formed by successively forming the bottom plate, the dielectric layer, and the top plate, patterning these layers as required after their formation. The first conductive via is formed over and electrically connected to the bottom plate and the second conductive via is formed over and connected to the top capacitor plate thereby providing for interconnection of the capacitor to other circuit elements by way of the dual damascene conductive runners connected to the conductive vias.

10 Claims, 6 Drawing Sheets

JUNCTION CAPACITOR STRUCTURE AND FABRICATION METHOD THEREFOR IN A DUAL DAMASCENE PROCESS

FIELD OF THE INVENTION

The present invention is directed to integrated circuit semiconductor devices incorporating junctions of varying conductivity types designed to conduct current and methods of making such devices. More specifically, the present invention relates to a capacitor structure for integrated circuit semiconductor devices employing a dual damascene interconnect system and a process for fabricating such capacitors.

BACKGROUND OF THE INVENTION

In integrated circuit semiconductor devices, capacitors can be formed as junction capacitors or thin-film capacitors. As is known, the application of a reverse bias voltage across a semiconductor junction forces the mobile carriers to move away from the junction thereby creating a depletion region. The depletion region acts as the dielectric of a parallel-plate capacitor, with the depletion width representing the distance between the plates. Thus the junction capacitance is a function of the depletion width, which is in turn a function of the applied reverse bias and the impurity concentrations in the vicinity of the junction.

Thin-film capacitors, which are a direct miniaturization of conventional discrete parallel-plate capacitors, can be also be fabricated in an integrated circuit. Like the discrete capacitor, the thin-film capacitor comprises two conductive layers separated by a dielectric. One type of thin-film capacitor is formed as a metal-oxide-semiconductor capacitor, having a highly doped bottom plate, a silicon dioxide dielectric layer, and a metal top plate. The dielectric layer can also be formed from other materials, such as tantalum pentoxide, barium titanate, strontium titanate and barium strontium titanate, silicon nitride or silicon dioxide. The bottom plate is typically formed from highly doped polycrystalline silicon (polysilicon). The top plate can be formed from various metals, including titanium nitride, titanium, tungsten or platinum. Alternatively, a thin-film capacitor can be formed with two metal layers forming the top and bottom plates, separated by the dielectric layer. The layers are patterned and etched to achieve the desired size and capacitance value.

Conventionally, the interconnection between device active areas formed in a semiconductor substrate is provided by conductive metal layers including conductive traces or lines formed in multiple levels of the substrate and interconnected by conductive vertical vias or plugs. First level vias provide electrical connection to the device active areas. Vias at higher levels interconnect adjacent levels of conductive traces. Forming these metallization layers requires conductor deposition, patterning, masking and etching steps to form the conductive traces, and patterning and deposition steps to form the conductive plugs.

Metal vias connected to device active areas (e.g., the electrode of a MOSFET gate, or the source and drain regions) are typically referred to as the metal-1 metallization layer or the first level of metallization. Metal vias in upper levels interconnect vertically-adjacent conductive traces, where the conductive traces are referred to as the metal-2 layer. For simplicity, both metal-to-semiconductor and metal-to-metal electrical connections are referred to herein as metal interconnections or metal interconnects.

Recently, great interest has been shown in the use of copper alloys for metalization within semiconductor devices. Compared with aluminum, copper has both beneficial electromigration resistance and a relatively low resistivity of about 1.7 micro-ohm-cm. Unfortunately, copper is a difficult material to etch. Consequently, dual damascene processes have been developed to simplify the process and eliminate metal etching steps.

The dual damascene structure has a lower conductive via that contacts an underlying device active area or an underlying conductive runner in a lower interconnect level. Thus the conductive via provides the same function as the plug structure in a traditional interconnect system. The dual damascene structure further includes an upper inlaid conductive runner to interconnect conductive vias. The conductive vias and the interconnecting conductive runners are formed by first forming vias and interconnecting horizontal trenches within a dielectric layer of the device. Then a conductive material, e.g., copper, is simultaneously deposited in both the vias and trenches. This process eliminates the need to form a plug structure and an overlying conductive layer during separate processing steps, according to the conventional interconnect system.

Capacitors can be formed within a well formed within a dual damascene structure as described in the commonly-assigned U.S. Pat. No. 6,320,244. The capacitor comprises three overlying layers formed within the well, including a first electrode lining the well, a capacitor dielectric layer formed thereover, and a second electrode formed over the dielectric layer.

BRIEF SUMMARY OF THE INVENTION

A capacitor for a dual damascene interconnection system comprises a bottom plate, a capacitor dielectric layer and a top plate formed in a dielectric substrate. The dielectric substrate overlies a barrier layer on the upper surface of a dual damascene structure, including conductive vias and overlying conductive runners. Each of the conductive vias is electrically connected to one of the top or bottom plate of the capacitor.

BRIEF DESCRIPTION OF THE DRAWINGS

The present invention can be more easily understood and the further advantages and uses thereof more readily apparent, when considered in view of the description of the preferred embodiments and the following figures in which.

In accordance with common practice, the various described features are not drawn to scale but are drawn to emphasize specific features relevant to the invention. Reference characters denote like elements throughout the figures and text.

DESCRIPTION OF THE PREFERRED EMBODIMENTS

The present invention will now be described with reference to the accompanying drawings, in which preferred embodiments of the invention are shown. The invention may, however, be embodied in many different forms and should therefore not be construed as limited to the embodiments set forth herein.

The present invention is directed to a capacitor structure and associated fabrication techniques for fabricating a metal-oxide-metal capacitor in conjunction with a dual damascene metallization process. In another embodiment, doped polysilicon can be used in lieu of metal to form the capacitor plates.

Figure 1:
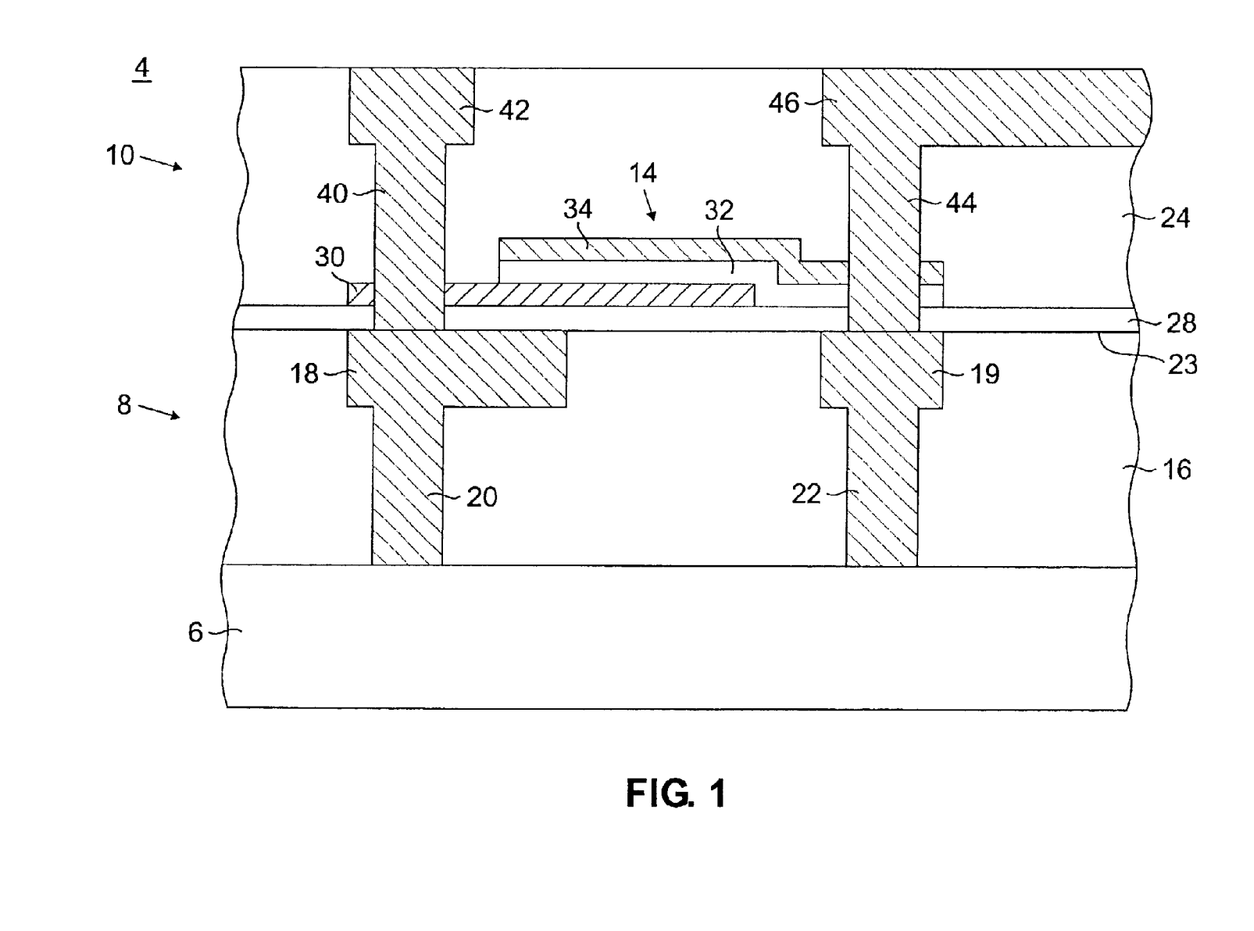
FIG. 1 is a cross-sectional view of an integrated circuit device constructed according to the teachings of the present invention.

Referring to FIG. 1, an integrated circuit device 4 includes a semiconductor substrate 6 in which various devices, such as transistors (not shown) are formed using known semiconductor processing techniques. A first-level dual damascene interconnect structure 8 interconnects the devices and further provides an electrical connection to a second-level dual damascene interconnect structure 10 and a capacitor 14, both of which are formed overlying the first-level dual damascene interconnect structure 8, according to the teachings of the present invention.

The first-level dual damascene interconnect structure 8 is formed in a dielectric stack 16, in accordance with known techniques, and comprises conductive runners 18 and 19 extending into the page and formed in perpendicular relationship with underlying conductive vias 20 and 22, respectively. Certain barrier and seed layers formed adjacent the conductive runners 18 and 19 and adjacent the conductive vias 20 and 22 according to known damascene techniques are not shown. Conventionally, the conductive runners 18 and 19 and the conductive vias 20 and 22 are formed of copper. The dielectric stack 16 is preferably a material with a relatively low dielectric constant (less than about 4) to limit the parasitic capacitance between the conductive vias 20 and 22 and the conductive runners 18 and 19. A copper diffusion barrier layer 28 is formed on the top surface 23.

The capacitor 14 comprises a bottom plate 30 formed from a conductive material that adheres to the copper diffusion barrier layer 28. After the bottom plate 30 is patterned (through masking and etching steps), a dielectric layer 32 and a top conductive capacitor plate 34 are formed thereover. The dielectric layer 32 and the top plate 34 are etched and patterned as described below.

The dual damascene interconnect structure 10 formed within a dielectric stack 24, comprises a conductive via 40 interconnecting the conductive runner 18 and a conductive runner 42, and further electrically connected to the bottom plate 30 of the capacitor 14. The dual damascene interconnect structure 10 further comprises a conductive via 44 interconnecting the conductive runner 19 and a conductive runner 46, and further electrically connected to the top plate 34.

The dielectric stack 16 shown in FIG. 1, including the dual damascene interconnect structure 8, is an exemplary underlying layer for the capacitor 14. Those skilled in the art appreciate that a plurality of interconnect layers are present at multiple levels throughout the integrated circuit device 4. Thus the capacitor 14 can be formed in any of these interconnect levels. Also, in another embodiment the capacitor 14 is formed in conjunction with a single damascene process.

Figure 2:
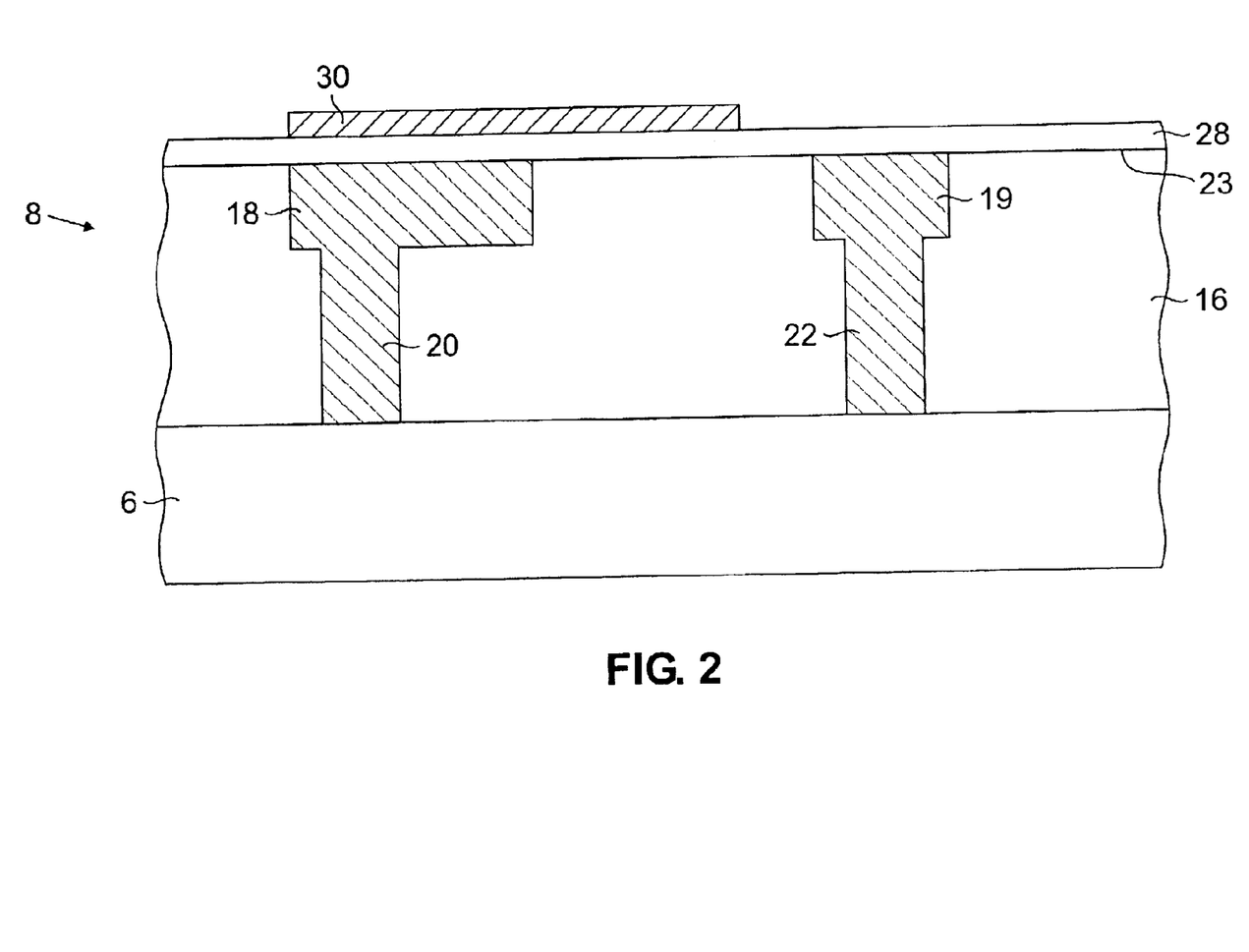
FIGS. 2 through 6 illustrate sequential fabrication steps of a capacitor according to the teachings of the present invention.

Referring now to FIGS. 2 through 6, a dual damascene process for forming an integrated circuit device 4 and a process for forming the capacitor 14 in accordance with the teachings of the present invention are now described. As shown in FIG. 2, the dielectric stack 16 is provided and the dual damascene interconnect structure 8 is formed therein, including the conductive runners 18 and 19, their associated conductive vias 20 and 22 and a barrier layer 28. To form the dual damascene interconnect structure 8 vertical openings and horizontal trenches are formed within the dielectric stack 16 by conventional etching processes. The openings extend downwardly to contact device regions (not shown) that extend to the upper surface of the semiconductor substrate 6. Although not shown in FIG. 2, a barrier layer and a seed layer are formed on the side walls and bottom surface of the trenches and vertical openings prior to electrodeposition of the copper. The barrier layer is sputtered into the trench; candidate materials include tantalum, tantalum-nitride, titanium and titanium-nitride. The seed layer is conventionally a thin copper layer preferably deposited by sputtering. The seed layer advantageously serves as a starting layer for the subsequent electroplating of copper into the trenches and vias in accordance with conventional dual damascene processing. Alternatively, the barrier layer and the seed layer may be deposited by conventional chemical vapor deposition or other methods well know in the art.

In lieu of copper, using known reflow techniques, aluminum can be formed in the vertical openings to form the conductive vias. In this embodiment, the barrier layer 28 serves as an etch stop layer to prevent etching of the underlying aluminum conductive plugs during formation of the overlying vertical vias. Further a wetting layer/barrier layer, comprising, for example, a titanium/titanium nitride/titanium stack, is required on the side walls of the vertical openings before formation of the aluminum therein. See for example the commonly-owned U.S. Pat. Nos. 5,523,259 and 5,641,994 where the formation of aluminum in trenches and vias is described.

Following formation of the conductive runners 18 and 19, the dielectric stack 16 is subjected to a chemical/mechanical polishing step to planarize the top surface 23 to remove any copper overfill. The copper diffusion barrier layer 28, commonly comprised of silicon nitride, silicon carbide, silicon oxy-carbide or silicon oxy-nitride, is then formed over the top surface 23 to prevent diffusion of the copper from the conductive runners 18 and 19 into any adjacent dielectric materials.

According to the present invention, the capacitor bottom plate 30 is then formed over the barrier layer 28 and patterned and etched in a first masking step as required to provide the desired shape and size. The bottom plate 30 can be formed from, for example, titanium, titanium nitride and tantalum nitride, by physical or chemical vapor deposition processes, or other processes known to those skilled in the art.

Figure 3:
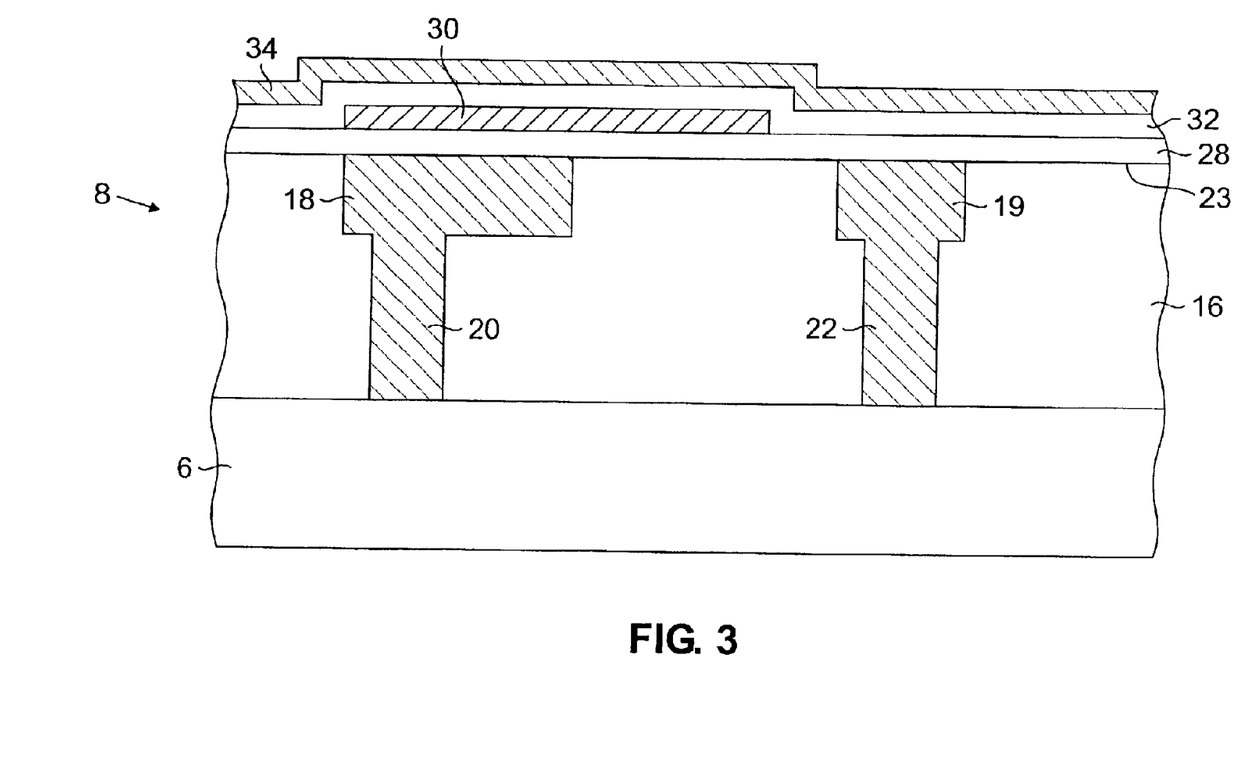

As illustrated in FIG. 3, the capacitor dielectric layer 32 is deposited over the bottom plate 30 and the exposed regions of the barrier layer 28. The capacitor dielectric layer 32 can be formed from any of the following materials, among others that are known to those skilled in the art: silane oxide, tantalum pentoxide, barium titanate, strontium titanate, barium stontium titanate, hafnium oxide and silicon dioxide. The dielectric layer 32 is deposited using chemical vapor deposition or similar methods known to those skilled in the art. The top capacitor plate 34 is formed over the dielectric layer 32. The top capacitor plate 34 can be formed from the same material as the bottom capacitor plate 30.

Figure 4:
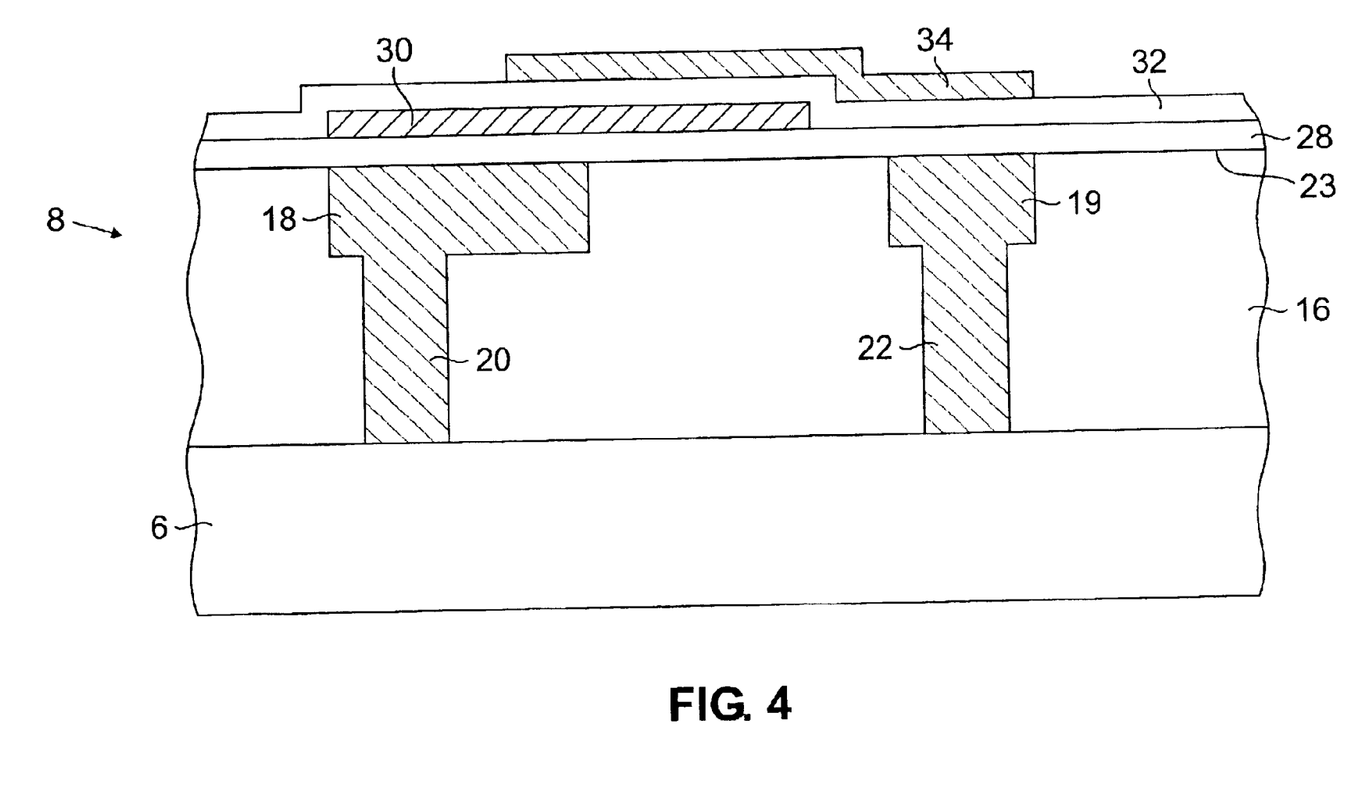
Figure 5:
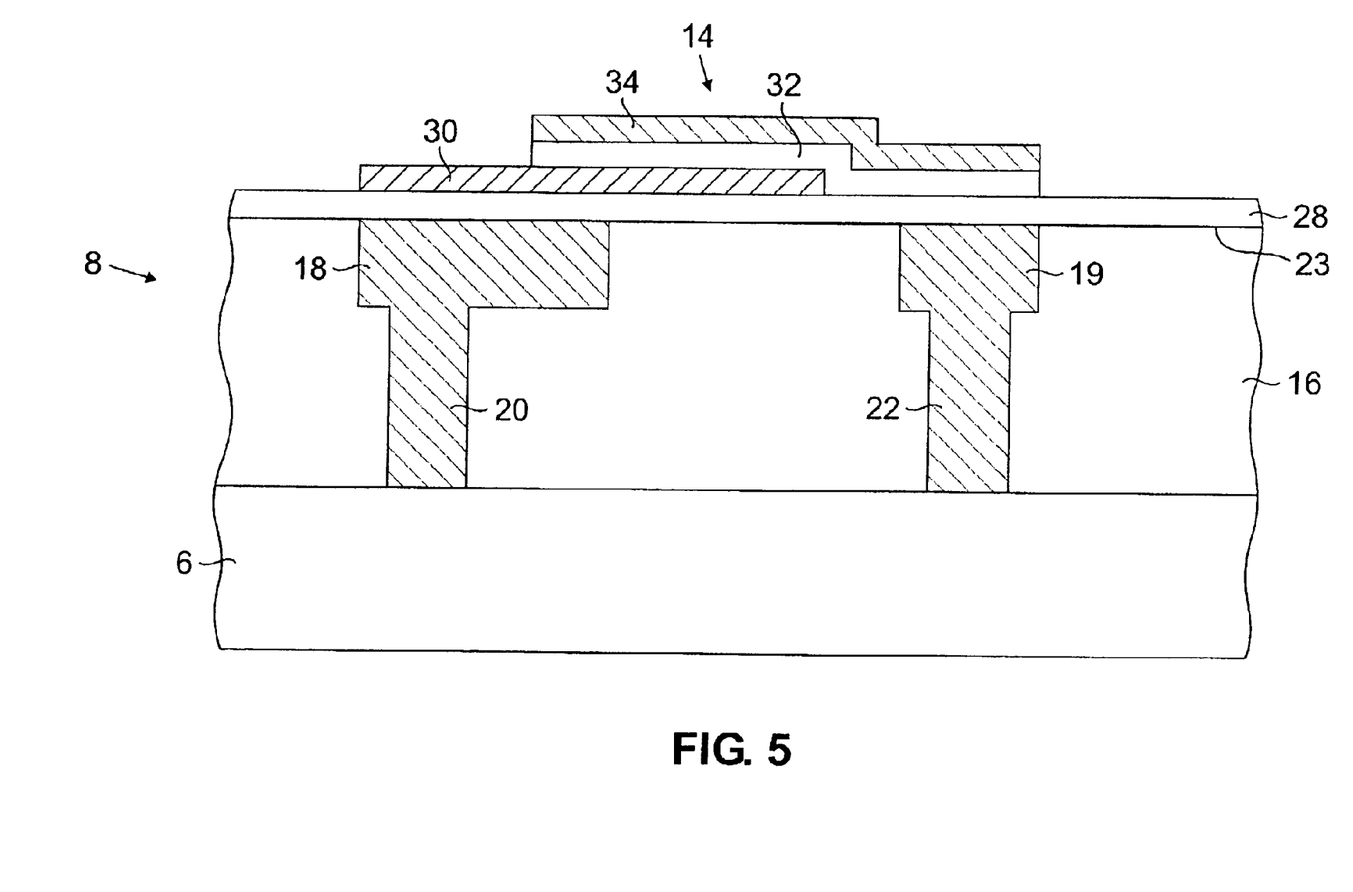
Figure 6:
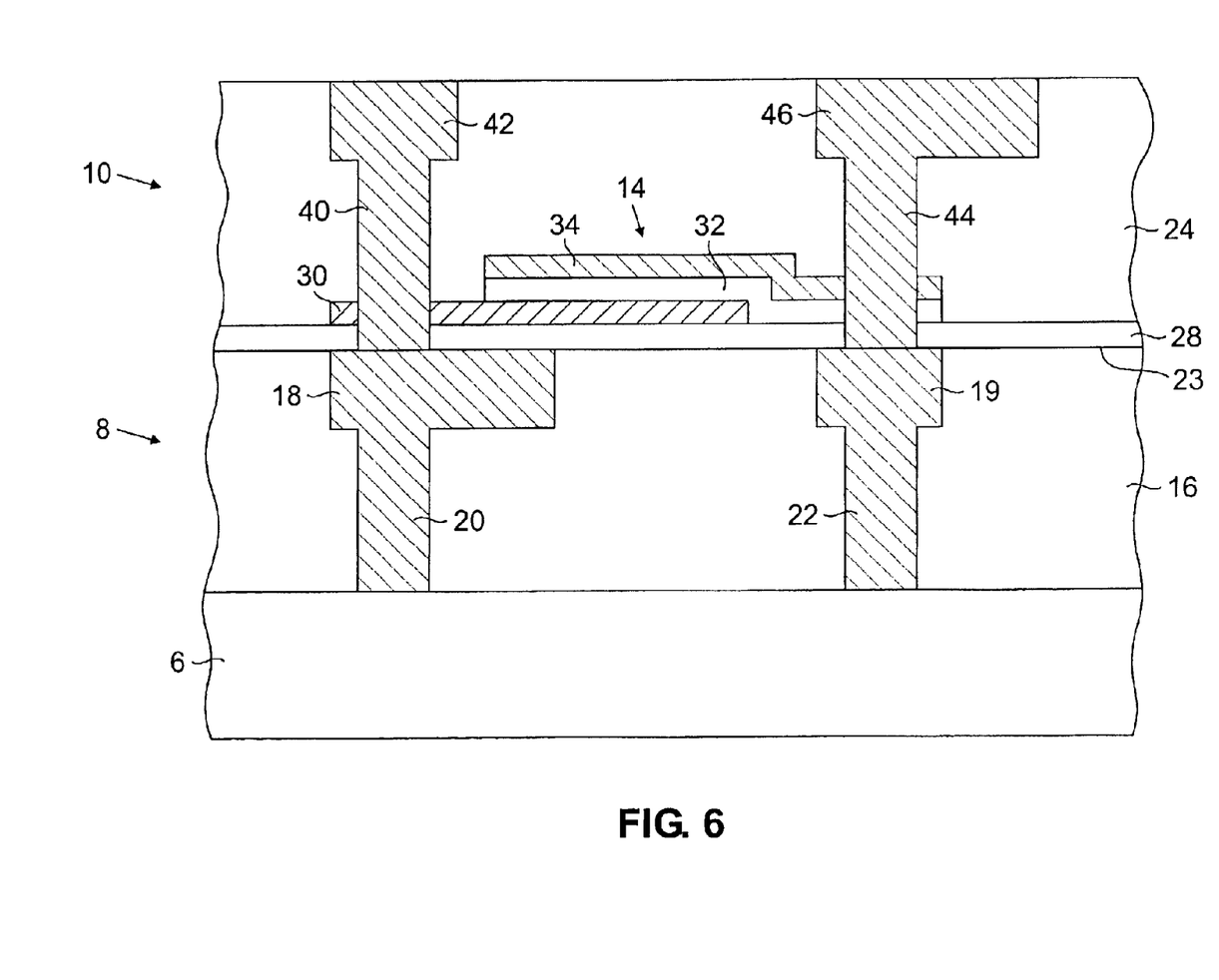

As shown in FIG. 4, the top plate 34 is shaped and dimensioned by patterning and etching in a second masking step. Next the capacitor dielectric layer 32 is etched back into alignment with the top plate 34 as illustrated in FIG. 5. This step, referred to as blanket masking, does not require the creation of an additional mask because the top plate 34 serves as the mask to define the final shape of the dielectric layer 32. Thus the present invention requires only two masking steps, which is fewer than the prior art capacitor fabrication processes.

Fabrication of the integrated circuit device 4 continues with the conventional formation of a dielectric stack 24, including the dual damascene interconnect structure 10, over the dielectric stack 16, and the capacitor 14. See FIG. 6. The dual damascene interconnect structure 10, comprising the conductive runners 42 and 46 overlying the conductive vias 40 and 44, is formed in a manner similar to the formation of the dual damascene interconnect structure 8 as described above. The vertical via for the conductive via 40 extends downwardly through the bottom capacitor plate 30 and the barrier layer 28, to the conductive runner 18. Thus when the via is filled with copper, the conductive via 40 is electrically connected to the conductive runner 42, the bottom plate 30 and the conductive runner 18. Similarly, the vertical via for the conductive via 44 extends downwardly through the top plate 34, the capacitor dielectric layer 32 and the barrier layer 28, to the conductive runner 19. Thus when the via is filled with copper, the conductive via 44 is electrically connected to the conductive runner 46, the top plate 34 and the conductive runner 19. Thus the capacitor 14 is electrically connected into the integrated circuit 4 through the various dual damascene interconnect structures, as described.

Those skilled in the art recognize that a capacitor formed according to the teachings of the present invention can be fabricated at various sites as required by the circuitry of the integrated circuit device 4. Further, the capacitor can be formed in any of the interconnect layers as required. The capacitor can be sized as required, as the capacitance is a function of the dielectric layer thickness and material, and the top and bottom plate areas.

Advantageously, a capacitor formed according to the teachings of the present invention requires fewer masks and masking steps, as the dielectric layer 32 is patterned by self-alignment to the top plate 34, as described above. Thus the device fabrication cost is lower and the fabrication time is reduced. The etch stop layer discussed in conjunction with the prior art process for forming thin film capacitors is not required. Also, formation of the bottom plate 30 over the barrier layer 28 reduces keyholing effects in the bottom plate 30. It is known in the art that tungsten plugs may have irregular or uneven upper surfaces, with seams or "keyholes" therein. As a capacitor plate is formed over a keyholed surface, irregularities form as the plate material fills the keyholes. As a result, the capacitance value deviates from the desired capacitance. According to the teachings of the present invention, these keyholing effects are eliminated as the capacitor plates are not formed over tungsten or any other material that can exhibit keyholing effects.

The dual damascene interconnect structure 8 presents a flat surface over which the capacitor 14 of the present invention is formed, in contrast to the prior art commonly-owned patent cited above where the capacitor is formed in a well.

An architecture and process have been described as useful for forming a capacitor in an integrated circuit device. While specific applications of the invention have been illustrated, the principles disclosed herein provide a basis for practicing the invention in a variety of ways and in a variety of circuit structures. Numerous variations are possible within the scope of the invention. The invention is limited only by the claims that follow.

What is claimed is:

1. An integrated circuit device comprising:
   a dielectric substrate;
   first and second conductive vias within said dielectric substrate;
   first and second conductive runners overlying said first and said second conductive vias and in electrical contact therewith, respectively;
   third and fourth conductive vias within said dielectric substrate each comprising a lower surface and an upper surface, the lower surface of each of the conductive vias overlying and in electrical connection with said first and said second conductive runners, respectively;
   a capacitor comprising in stacked relation:
     a bottom plate electrically connected to said third conductive via intermediate the upper and the lower surfaces thereof;
     a dielectric layer; and
     a top plate in electrical connection with said fourth conductive via intermediate the upper and lower surfaces thereof.

2. The integrated circuit device of claim 1 wherein a material of the bottom plate and the top plate is selected from among titanium, titanium nitride and tantalum nitride.

3. The integrated circuit device of claim 1 wherein a material of the dielectric layer is selected from the group consisting of: silane oxide, tantalum pentoxide, strontium titantate, barium titanate, barium stontium titanate, hafnium oxide and silicon dioxide.

4. The integrated circuit device of claim 1 wherein a conductive material of the first and the second conductive vias and the first and the second conductive runners is selected from the group consisting of copper and aluminum.

5. The integrated circuit device of claim 1 wherein the first and the second conductive vias and the first and the second conductive runners are formed according to a dual damascene process.

6. The integrated circuit device of claim 1 wherein the first and the second conductive vias and the first and the second conductive runners are formed according to a single damascene process.

7. The integrated circuit device of claim 1 further comprising third and fourth conductive runners overlying and in electrical connection with the upper surface of the third and the fourth conductive vias, respectively.

8. A method for forming an integrated circuit device comprising:
   providing a semiconductor substrate layer;
   forming first and second conductive vias within the semiconductor substrate layer;
   forming first and second conductive runners in an upper region of the semiconductor substrate layer overlying the first and said second conductive vias and in electrical contact therewith, respectively;
   forming a bottom capacitor plate over a top surface of the semiconductor substrate layer;
   forming a capacitor dielectric layer over the bottom capacitor plate;
   forming a top capacitor plate overlying the capacitor dielectric layer;
   forming a substrate dielectric layer; overlying the top capacitor plate;
   forming third and fourth conductive vias within the substrate dielectric layer, wherein the third and the fourth conductive vias overly and are in electrical connection with the first and the second conductive runners and the bottom and the top capacitor plates, respectively.

9. The method of claim 8 wherein the step of forming the bottom capacitor plate further comprises forming a conductive material layer on the top surface of the semiconductor substrate layer, and removing predetermined regions of the conductive material layer.

10. The method of claim 8 wherein the steps of forming the capacitor dielectric layer and the top capacitor plate further comprise:
   forming the capacitor dielectric layer over the bottom capacitor plate;
   forming the top capacitor plate overlying the capacitor dielectric layer;
   removing predetermined regions of the top capacitor plate;
   removing predetermined regions of the capacitor dielectric layer by using the top capacitor plate as a mask to define the regions to be removed.

* * * * *

UNITED STATES PATENT AND TRADEMARK OFFICE
CERTIFICATE OF CORRECTION

PATENT NO. : 6,784,478 B2
DATED : August 31, 2004
INVENTOR(S) : Sailesh M. Merchant and Yifeng W. Yan It is certified that error appears in the above-identified patent and that said Letters Patent is hereby corrected as shown below:

Title page,
Item [54], Title, change "JUNCTION" to -- PLATE --

Signed and Sealed this

Fourteenth Day of December, 2004

JON W. DUDAS
*Director of the United States Patent and Trademark Office*